United States Patent [19]

Ueda et al.

[11] Patent Number: 5,195,099
[45] Date of Patent: Mar. 16, 1993

[54] SEMICONDUCTOR MEMORY DEVICE HAVING IMPROVED ERROR CORRECTING CIRCUIT

[75] Inventors: Osamu Ueda; Tsuyoshi Toyama, both of Hyogo, Japan

[73] Assignee: Mitsubishi Denki Kabushiki Kaisha, Tokyo, Japan

[21] Appl. No.: 908,808

[22] Filed: Jul. 7, 1992

Related U.S. Application Data

[63] Continuation of Ser. No. 461,968, Jan. 8, 1990, abandoned.

[30] Foreign Application Priority Data

Apr. 11, 1989 [JP] Japan ................................. 1-92532

[51] Int. Cl.⁵ .......................................... H03M 13/00
[52] U.S. Cl. .................................... 371/40.4; 371/40.1; 371/21.1; 365/200
[58] Field of Search .................. 371/40.4, 40.1, 40.2, 371/21.1, 21.2, 21.3, 21.4; 365/200, 201

[56] References Cited

U.S. PATENT DOCUMENTS

| | | | |
|---|---|---|---|
| 4,253,059 | 2/1981 | Bell ..................... | 371/21.4 |
| 4,531,213 | 7/1985 | Scheuneman ............ | 371/3 |
| 4,612,630 | 9/1986 | Rosier ................... | 371/21.4 X |
| 4,730,320 | 3/1988 | Hidaka .................. | 371/40.4 |
| 4,794,597 | 12/1988 | Ooba ..................... | 371/3 |
| 4,878,220 | 10/1989 | Hashimoto .............. | 371/3 X |
| 4,958,324 | 9/1990 | Devin .................... | 371/21.4 X |
| 4,967,415 | 10/1990 | Tanagawa ................ | 371/21.4 X |

OTHER PUBLICATIONS

H. Davis, "A 70-ns Word-Wide 1-Mbit ROM With On-Chip Error-Correction Circuits" IEEE Journal of Solid-State Circuits, vol. SC-20, No. 5 (Oct. 1985), pp. 958-963.

Memory Data book, Mitsubishi (1982), pp. 4-41-4-47.

*Primary Examiner*—Robert W. Beausoliel
*Assistant Examiner*—Ly V. Hua
*Attorney, Agent, or Firm*—Lowe, Price, LeBlanc & Becker

[57] ABSTRACT

A semiconductor memory device having an error correcting circuit includes a circuit for generating a desired test signal with which memory cells used for error correction are to be tested, and another circuit for judging on an chip-basis whether memory cells of the semiconductor memory device are normal or not. The memory cells for error correction can be tested accurately by application of desired test signal. In addition, since there is no necessity of provision of a circuit for comparing externally applied data and data delivered from the semiconductor memory device, a test can be preformed readily.

9 Claims, 8 Drawing Sheets

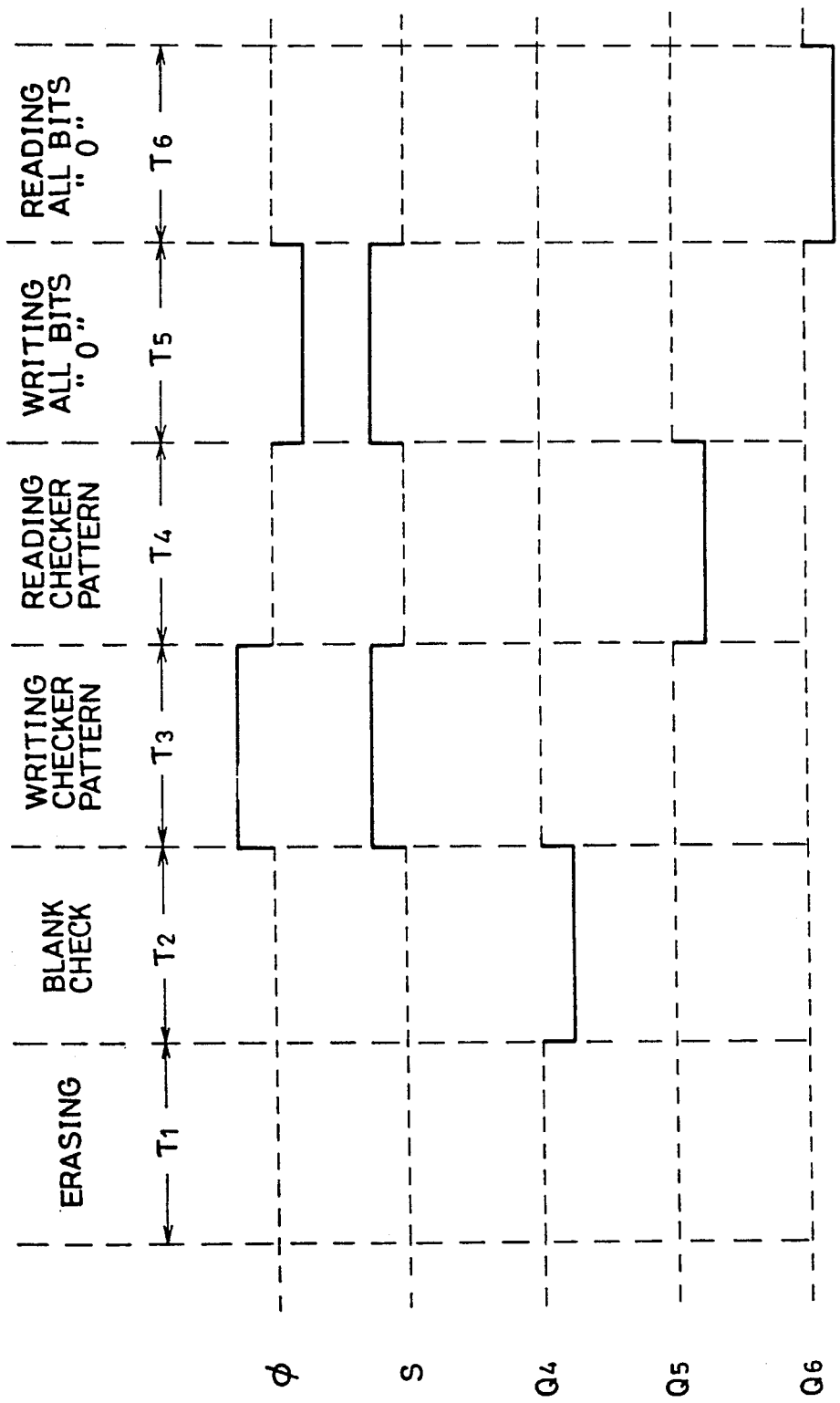

SEMICONDUCTOR MEMORY DEVICE HAVING IMPROVED ERROR CORRECTING CIRCUIT

This application is a continuation of application Ser. No. 07/461,968 filed Jan. 8, 1990, now abandoned.

BACKGROUND OF THE INVENTION

1. Field of the Invention

This invention relates generally to semiconductor memory devices having improved error correcting circuits, and more particularly to testing circuits for memory cells which are used for correction of an error.

2. Description of the Background Art

In recent years, the capacity of a semiconductor memory device has been increased remarkably by a high integration technique. As such integration proceeds, memory cells are likely to be defective. As countermeasure for defective memory cells produced in the other good memory cells, two methods are conventionally known, including a method which employs a redundancy circuit and another method which makes use of an error correcting circuit (hereinafter referred to as ECC). An ECC will be described in the following.

An ECC is provided in a semiconductor memory device such as, for example, an erasable programmable read-only memory device (hereinafter referred to as EPROM) in order to assure a high degree of reliability on data stored in the semiconductor memory device. An EPROM to which an ECC is applied includes memory cells for the ECC in addition to memory cells for storage of data. In the case of, for example, single bit error correction (SEC), where the bit length of a data word is m and the bit length of an additional word for the ECC is k, it is required for m and k to satisfy the following inequality:

$$2^k - 1 \geq m + k \qquad (1)$$

Combinations of such data bit lengths m and ECC bit lengths k which present integers are determined in accordance with the expression (1) above. The results are shown in Table 1 below.

TABLE 1

| Data Bit Length (m) | 4 | 8 | 16 | 32 | 64 |
|---|---|---|---|---|---|
| ECC Bit Length (k) | 3 | 4 | 5 | 6 | 7 |

FIG. 6 shows in a block diagram a conventional semiconductor memory device to which an ECC is applied. Referring to FIG. 6, the semiconductor memory device shown includes a plurality of memory cells 52 for storing data therein, ECC memory cells 62 for storing error correcting codes therein, a circuit 51 for reading stored data out of the memory cells 52 and for writing data into the memory cells 52, a circuit 61 for reading stored data out of the memory cells 62 and for writing data into the memory cells 62, an error detecting circuit 2, an error correcting circuit 3, a converting circuit for the ECC, and a control circuit 94 for the circuits listed above. Inputting and outputting of data are executed by way of a data inputting/outputting circuit 4.

FIG. 7 shows, in a circuit diagram, exemplary details of the circuits 1, 2 and 3 (hereinafter referred to as error correcting circuit section) shown in FIG. 6. In the circuit construction shown, the data bit length m is m=4 and the ECC bit length k is k=3 for simplification of explanation. In addition, in FIG. 7, the data reading/writing circuit 51 and the data storage cells 52 shown in FIG. 6 are shown as a single memory circuit 50 in a simplified form while the ECC reading/writing circuit 61 and the ECC storage memory cells 62 are shown as another single memory circuit 60.

Referring to FIG. 7, an ECC converting circuit 1 includes three exclusive OR (EXOR) gates 11 to 13 connected to receive data D0 to D3 from the data inputting/outputting circuit. The ECC memory circuit 60 is connected to receive data D0 to D3. The error detecting circuit 2 includes three gates 21 to 23 individually connected to receive output signals of the memory circuits 50 and 60 for individual bits. The error correcting circuit 3 includes four AND gates 33 to 36 connected to receive output signals of the error correcting circuit 2, three inverters 30 to 32, and further four EXOR gates 37 to 40 connected to receive signals from the AND gates 33 to 36 and the memory circuit 50. Output data signals Q0 to Q3 with which errors have been corrected by the error correcting circuit 3 are delivered by way of the EXOR gates 37 to 40.

Subsequently, operation for error correction will be described. In the example shown in FIG. 7, i-th data word di0 to di3 constituted from four bits D0 to D3 is written into the memory circuit 50. The i-th data word here denotes a word stored in or to be stored into memory cells designated by a pair of decoders 92 and 93 in response to an address signal Ai. Meanwhile, the EXOR gates 11 to 13 send output signals thereof to the memory circuit 60 in response to the data signals D0 to D3. The memory circuit 60 receives the output signals and stores them as an ECC word ci0 to ci2.

Commonly, an EXOR gate provides an output signal "0" in response to an even number of input signal or signals "1". To the contrary, an EXOR gate provides an output signal or signals "1". Accordingly, ECC word data specified by the EXOR gates 11 to 13 are stored into the ECC memory circuit 60 in response to the data signals D0 to D3.

When memory cells of the memory circuits 50 and 60 are normal, each of the EXOR gates 21 to 23 provides a signal "0" in response to an even number of input signal or signals "1". To the contrary, when there is some defect or abnormality with memory cells of the memory circuits 50 and 60, and particularly when one bit error takes place (i.e., when an error takes place only with a bit of word), one of the EXOR gates 21 to 23 provides an output signal "1". In the error correcting circuit 3, one of data di0 to di3 delivered from the memory circuit 50 is corrected by the EXOR gates 37 to 40 in response to the output signal "1" delivered from the one of the EXOR gates 21 to 23. As a result, data Q0 to Q3 with which the error has been corrected are delivered from the error correcting circuit 3.

Subsequently, description will be given of an example of data. For example, it is assumed that data (D3, D2, D1, D0) are (0, 0, 1, 0), respectively. In this instance, the data (0, 0, 1, 0) are stored as an i-th data word (di3, di2, di1, di0) into the memory circuit 50. Meanwhile, data (1, 0, 1) are stored as an ECC word (ci2, ci1, ci0) into the memory circuit 60 in response to the data D0 to D3.

When the memory cells of the memory circuits 50 and are normal, all of the EXOR gates 21 to 23 deliver an output signal "0". Consequently, all of the AND gates 33 to 36 provide an output signal "0" as a result, the EXOR gates 37 to 40 output data signals Q0 to 3 which are specified by the data word di0 to di3.

Operation when there is some defect or abnormality in any of the memory cells of the memory circuit 50, for example, when the data di2 is changed in value from "0" to "1" due to some defect or abnormality of the memory cell in which the data di2 is stored will be such as follows. In this instance, data (0, 1, 1, 0) are stored as a data word (di3, di2, di1) di0) in the memory circuit 50. When they are stored, the EXOR gates 22 and 23 provide an output signal "1" in response to the data di2. As a result, the AND gate 35 provides an output signal "1" while the other AND gates 33, 34 and 36 deliver an output signal "0". Accordingly, the data di2 with which an error takes place is corrected by the EXOR gate 39 in response to the signal "1" delivered from the AND gate 35.

Where the circuit shown in FIG. 7 is applied, even if data is reversed from "1" to "0" due to some defect of a memory cell, detection and correction of the error of the data are accomplished in a similar manner. However, when an error takes place for two or more bits, a proper correcting operation cannot be achieved.

Generally, in order to perform an inspection or test of a semiconductor memory device, it is desirable that arbitrary data can be written into memory cells to be tested. With regard to the memory circuit 50 shown in FIG. 7, that is, with regard to the data storage memory cells 52 shown in FIG. 6, arbitrary data can be written as data D0 to D3 into it from the outside. However, no arbitrary data can be written into the memory circuit 60, that is, the ECC memory cells 62 shown in FIG. 6 because the ECC converting circuit 1 is provided at the preceding stage. In particular, since data to be written into the ECC memory cells 62 are determined by the EXOR gates 11 to 13 in the circuit 1 in response to data D0 to D3, no arbitrary data can be written into the ECC memory cells 62. Consequently, writing of a checker pattern or writing of data "0" into all of memory cells which is commonly performed in inspection of a semiconductor memory cannot be accomplished readily. In addition, when written test data are read out, it is difficult to determine whether or not the ECC memory cells 62 are normal.

SUMMARY OF THE INVENTION

An object of the invention is to provide a semiconductor memory device wherein memory cells which are used for error correction can be tested accurately.

Another object of the invention is to provide a semiconductor memory device wherein desired test signals can be supplied to memory cells which are used for error correction.

A further object of the invention is to provide a semiconductor memory device wherein the judgement whether or not memory cells used for error correction are normal can be made on an on-chip basis.

A still further object of the invention is to provide a semiconductor memory device wherein test signals for memory cells used for error correction can be generated on an on-chip basis.

A yet further object of the invention is to provide a semiconductor memory device wherein test signals for memory cells used for error correction can be applied externally.

A yet another object of the invention is to provide an EPROM wherein memory cells used for error correction can be tested accurately.

A still another object of the invention is to provide an EPROM wherein desired test signals can be supplied to memory cells which are used for error correction.

A still further object of the invention is to provide an EPROM wherein the judgement whether or not memory cells used for error correction are normal can be made on an on-chip basis.

A still further object of the invention is to provide an EPROM wherein test signals for memory cells used for error correction can be generated on an on-chip basis.

An additional object of the invention is to provide an EPROM wherein test signals for memory cells used for error correction can be applied externally.

Briefly described, according to the present invention, there is provided a semiconductor memory device having an error correcting function. The memory device comprises first memory cells for storing data signals therein, second memory cells for storing error correcting signals for error correction therein, an error detecting circuit responsive to output signals of the first and second memory cells for detecting an error of data stored in the first memory cells, an error correcting circuit connected to the first memory cells responsive to the error detecting circuit correcting an error of a signal outputted from the first memory cell, a test signal supplying circuit connected to the second memory cells responsive to an externally applied testing mode selecting signal for supplying predetermined test signals to the second memory cells, the second memory cells being responsive to the test signals supplied thereto to develop a signal indicative of a result of the test, and a determining circuit connected to the second memory cells responsive to the signal indicative of a result of the test for determining a state of the second memory cells.

In operation, predetermined arbitrary test signals can be supplied to the second memory cells for storing error correcting signals by the test signal supplying circuit. In addition, since the determining circuit is provided, a state of the second memory cells can be determined in accordance with a signal delivered from the second memory cells.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 4B is a timing chart illustrating operation of the circuitry shown in FIG. 4A;

DESCRIPTION OF THE PREFERRED EMBODIMENTS

Figure 1:
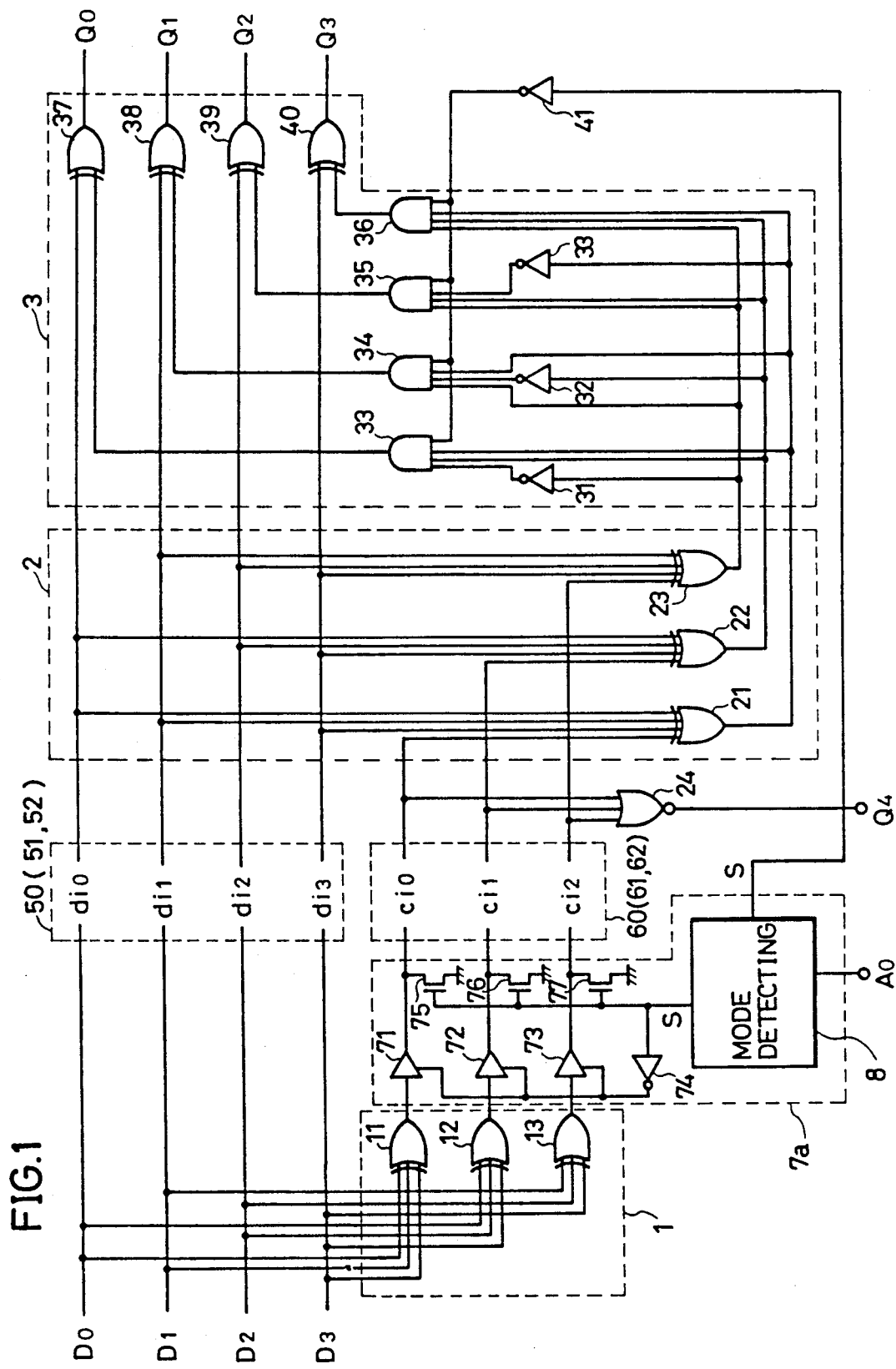
FIG. 1 is a circuit diagram of an error correcting circuit of a semiconductor memory device showing a preferred embodiment of the present invention.
Figure 7:
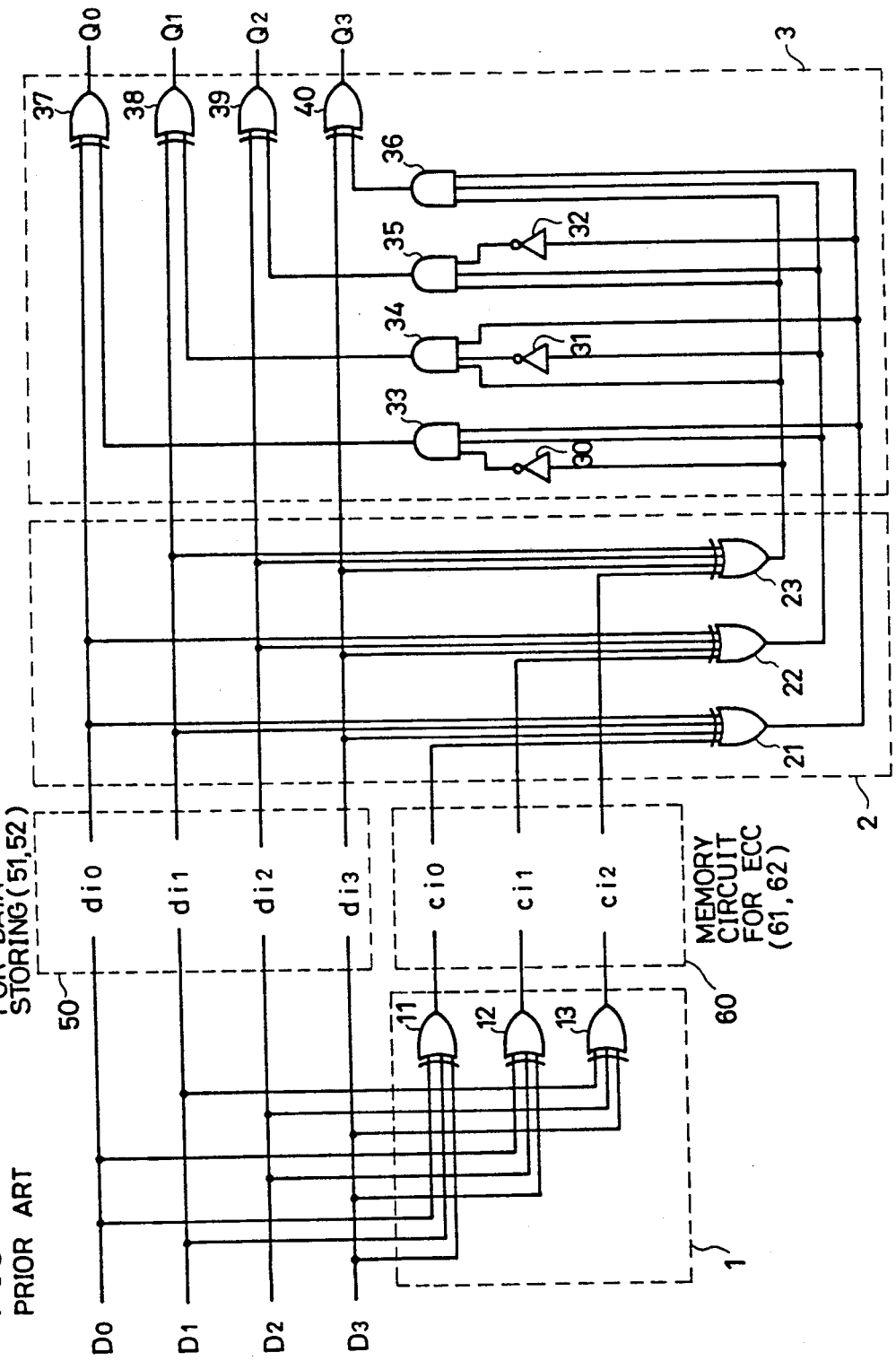
FIG. 7 is a circuit diagram showing the error correcting circuit shown in FIG. 6.

Referring first to FIG. 1, there is shown an error correcting circuit of a semiconductor memory device according to the present invention. The error correcting circuit can be applied, for example, to an EPROM. The error correcting circuit shown is different in the following points from the circuit shown in FIG. 7. In particular, in the circuit shown in FIG. 1, an ECC data generating circuit 7a is connected between a converting circuit 1 and an error correcting memory cell circuit 60. When a testing mode is designated from the outside, the data generating circuit 7a provides a signal "0" of three bits to the memory cells circuit 60. In addition, an NOR gate 24 is connected to receive output signals of the memory cells circuit 60. The NOR gate 24 develops, in response to signals from the memory cell circuit 60, an inverted signal Q4 representing whether memory cells of the memory cell circuit 60 are normal or not, and delivers the inverted signal Q4 to the outside by way of a terminal of the error correcting circuit. Accordingly, it is pointed out that the NOR gate 24 serves as a circuit which inverts an abnormality of the circuit 60. AND gates 33 to 36 are controlled by a signal S which is provided from a circuit 8 by way of an inverter 41.

The ECC data generating circuit 7a includes three tri-state buffers 71 to 73 connected to outputs of EXOR gates 11 to 13, three NMOS transistors 75 to 77 connected between the ground and outputs of the tri-state buffers 71 to 73, respectively, an inverter 74, and a mode detecting circuit 8 for detecting designation of an error correcting mode from the outside. The mode detecting circuit 8 may include a high voltage detecting circuit connected to a commonly used address terminal AO. Designation of an error correcting mode is effected by externally providing to the terminal AO a voltage higher than a high voltage level of a normal address signal. Thus, the mode detecting circuit 8 develops a signal S of a high voltage level in response to such higher voltage received at the terminal AO. The tri-state buffers 71 to 73 provide outputs which are brought into a floating state when the signal S presents a high voltage level. To the contrary, when the signal S presents a low voltage level, signals delivered from the converting circuit 1 are delivered to the memory circuit 60 by way of the tri-state buffers 71 to 73.

Subsequently, operation will be described. When an ordinary operation is to be performed, an address signal of an ordinary voltage level is applied to the terminal AO. consequently, the mode detecting circuit 8 develops a signal S of a low voltage level. Accordingly, output signals of the EXOR gates 11 to 13 in the circuit 1 are transmitted to the memory circuit 60. Accordingly, an error correcting operation is executed in a similar manner as in the circuit shown in FIG. 7.

To the contrary, in a testing mode for the ECC memory cells, a higher voltage is applied to the terminal AO. Consequently, the mode detecting circuit 8 develops a signal S of a high voltage level. The tri-state buffers 71 to 73 bring outputs thereof into floating state in response to such signal S. The transistors 75 to 77 are turned on in response to the signal S so that signals of a low voltage level are provided to the memory circuit 60. In case there are some defects in the memory circuit 60, the NOR gate 24 delivers a signal Q4 of a low voltage level. On the contrary, in case there is no defect in the memory circuit 60, a signal Q4 of a high voltage level is delivered from the NOR gate 24. Thus, presence of some defects of ECC memory cells in the memory circuit 60 can be found based on judgment of a voltage level of the signal Q4.

Figure 2:
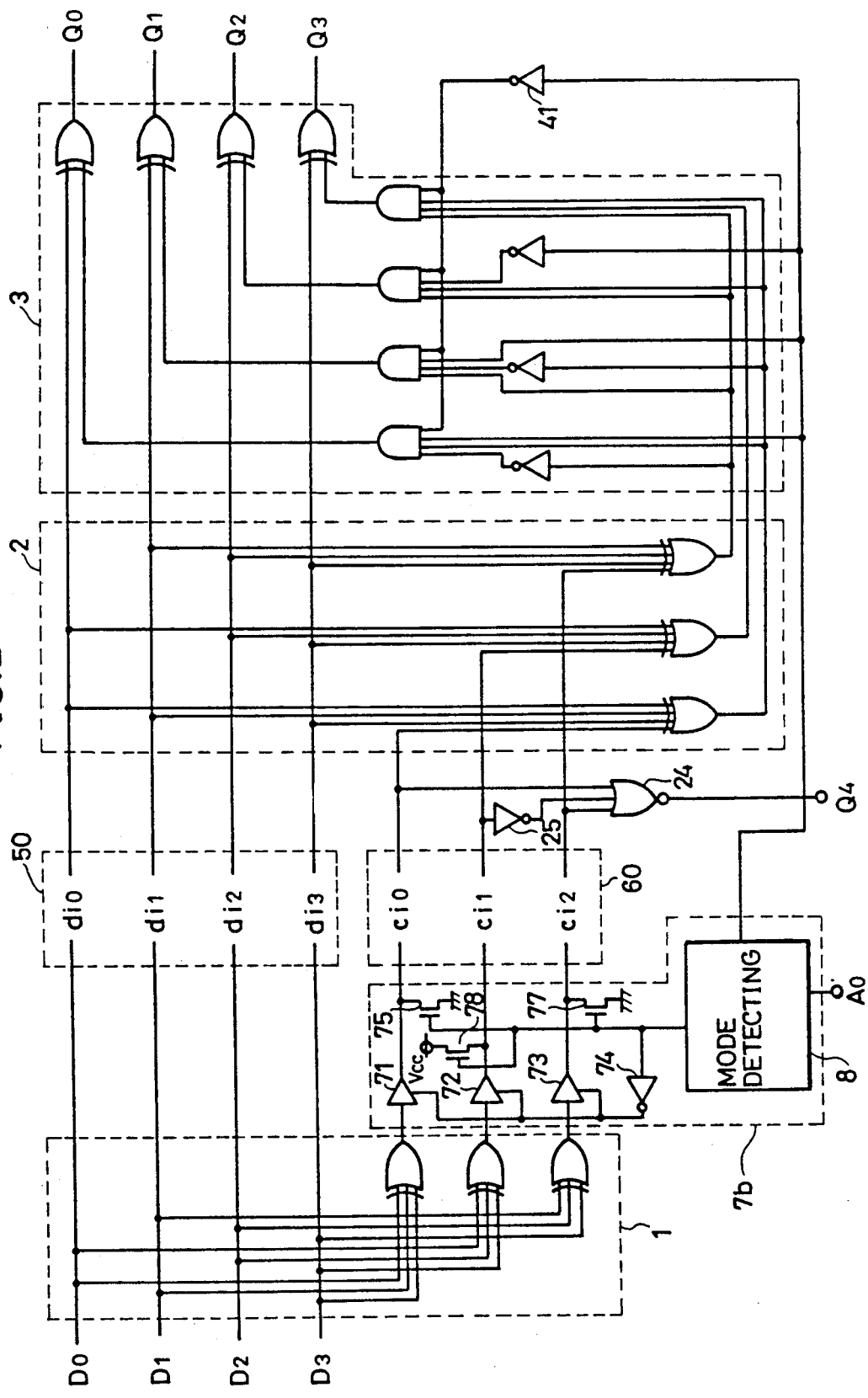
FIG. 2 is a circuit diagram of an error correcting circuit showing another preferred embodiment of the present invention.

Referring now to FIG. 2, there is shown an error correcting circuit of a semiconductor memory device according to a second preferred embodiment of the present invention. When compared with the circuit shown in FIG. 1, an ECC data generating circuit 7b shown in FIG. 2 is different in that a pull-up NMOS transistor 78 is connected between an output of a tri-state buffer 72 and a power source Vcc. In particular, the ECC data generating circuit 7b can supply, in a testing mode, a signal of a checker pattern to a memory circuit 60. Such a checker pattern includes a series of alternate data of "0" and "1" and is useful for discovery of a defective memory cell. In particular, the checker pattern is useful to find out whether or not there are some defects caused by an interaction between transistors of adjacent memory cells. An inverter 25 is connected to an output of the memory circuit 60. Accordingly, a defect of a memory cell can be found out by detecting an output voltage of the EXOR gate 24 similarly as in the circuit shown in FIG. 1.

Figure 3:
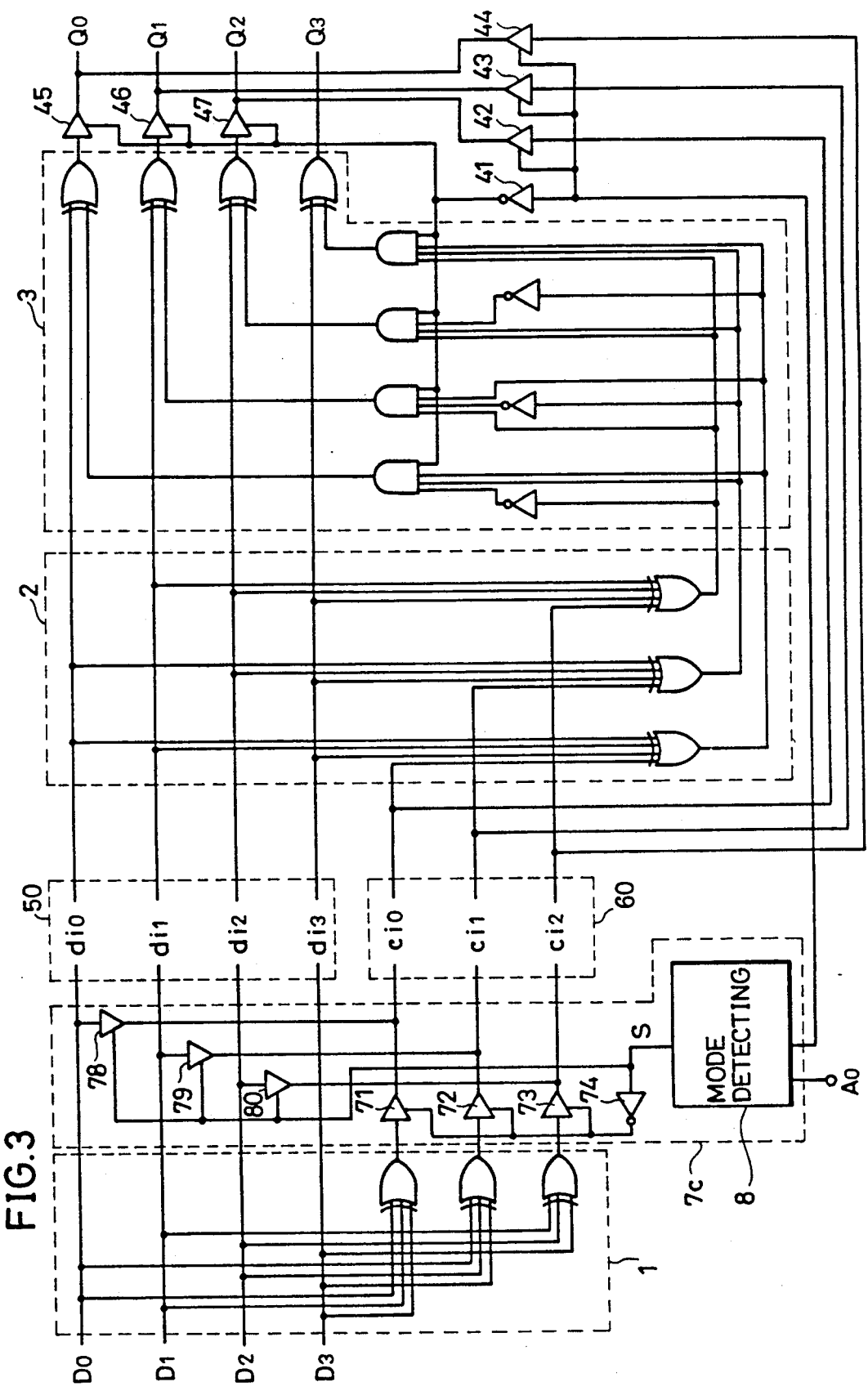
FIG. 3 is a circuit diagram of an error correcting circuit showing a further preferred embodiment of the present invention.

Referring to FIG. 3, there is shown an error correcting circuit of a semiconductor memory device according to a third preferred embodiment of the present invention. In the circuit shown, a switching circuit 7c is connected between a converting circuit 1 and a pair of memory circuits 50 and 60. The switching circuit 7c includes three tri-state buffers 78 to 80 for selectively delivering externally provided data D0 to D2 to the memory circuit 60. The tri-state buffers 78 to 80 are turned on in response to a signal S of a high voltage level delivered from a mode detecting circuit 8. Accordingly, arbitrary data to be provided to ECC memory cells can be applied from the outside in a testing mode. Data read out from the memory circuit 60 are delivered as output data Q0 to Q2 by way of tri-state buffers 42 to 44. By comparing the data D0 to D2 written in the memory circuit 60 respectively with the data Q0 to Q2 thus read out, a defective ECC memory cell can be found out.

Figure 4A:
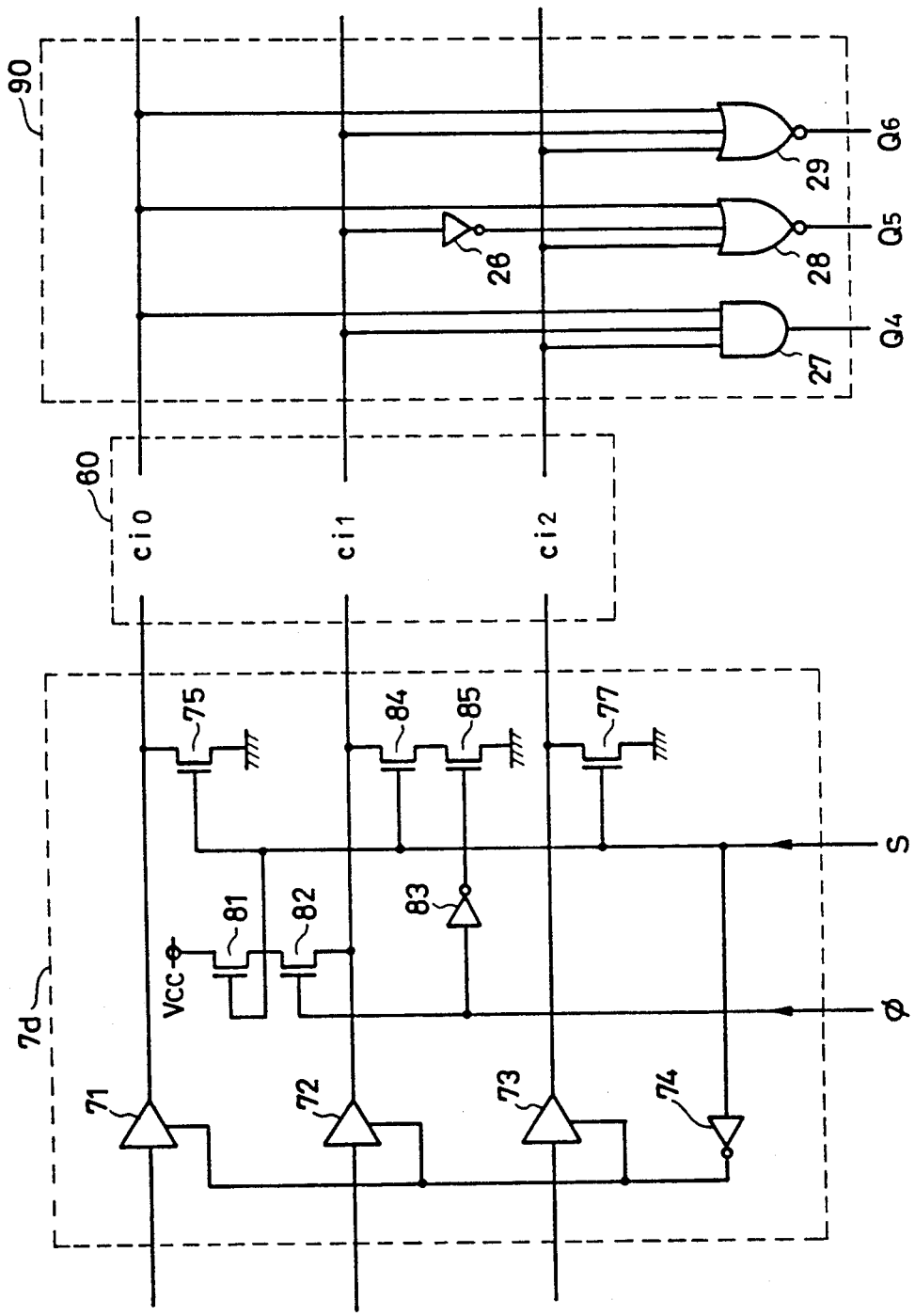
FIG. 4A is a circuit diagram of an ECC data generating circuit and a judging circuit showing a still further preferred embodiment of the present invention.

FIG. 4A shows an ECC data generating circuit 7D and a judging circuit 90 according to a fourth preferred embodiment of the present invention. Referring to FIG. 4A, the ECC data generating circuit 7d includes three tri-state buffers 71 to 73 which operate in response to a signal S, up to six NMOS transistors 75, 77, 81, 82, 84 and 85 which constitute circuits for pulling up and down output nodes for the individual bits, and two inverters 74 and 83. ECC data to be supplied to the memory circuit 60 are selected by an externally controlled selecting signal φ. The judging circuit 90 includes an AND gate 27 connected to receive signals of the individual bits delivered from the memory circuit 60, a pair of EXOR gates 28 and 29, and an inverter 26. The judging circuit 90 develops output signals Q4 to Q6 with which a defect of ECC memory cell in the memory circuit 60 is to be judged in a testing mode.

Operation of the circuit shown in FIG. 4A is illustrated in a timing chart of FIG. 4B. Commonly, an EPROM has data of "1" stored in all of memory cells thereof after precedingly stored signals of the memory cells have been erased by ultraviolet rays. Such state wherein data "1" is stored in all of the memory cells is called blank state. A test for the verification of a blank state is called blank check. In testing of EPROM, normally such a write check as described below is performed after execution of a blank check.

In a write checking mode, data of a predetermined test pattern are written into the memory cells, and the thus written data are read out from the EPROM. A defect of a memory cells is thus detected by comparison between the written data and the read out data. A pattern for writing data of "0" to all memory cells and such a checker pattern as described hereinabove are used frequently as a test pattern.

Subsequently, operation will be described briefly with reference to FIGS. 4A and 4B. It is to be noted that the following description proceeds on the assumption that the circuit shown in FIG. 4A is applied to an EPROM. At first, all data stored in memory cells of the EPROM are erased by ultraviolet rays (period T1). Then in a subsequent period T2, such a blank check as described above is executed. In particular, normality of the ECC memory cells is confirmed when the signal Q4 presents a low voltage level.

In a subsequent period T3, signals ϕ and S of a high voltage level are delivered to the ECC data generating circuit 7d. The transistors 75, 77 and 81 are turned on in response to the signal S. Meanwhile, the transistor 82 is turned on in response to the signal ϕ. As a result, data signals of the checker pattern are delivered to the memory cell circuit 60. After the checker pattern has been written, reading thereof is executed in a period T4. Thus, the EXOR gate 28 develops a signal Q5 of a low voltage level when the ECC memory cells are normal.

Further in a period T5, a signal ϕ of a low voltage level and a signal S of a high voltage level are provided. The transistors 75, 77, 84 and 85 are turned on in response to the signals ϕ and S. Accordingly, data "0" is written into all of the memory cells of the memory circuit 60. Then in a period T6, when the signal Q6 is at a low voltage level, it is detected that there is no defect present in any of the ECC memory cells. Accordingly, any of the error correcting circuits shown in FIGS. 1 to 4A can generally be applied to a semiconductor memory device, but a peculiar effect can be attained particularly where it is applied to an EPROM.

Figure 5:
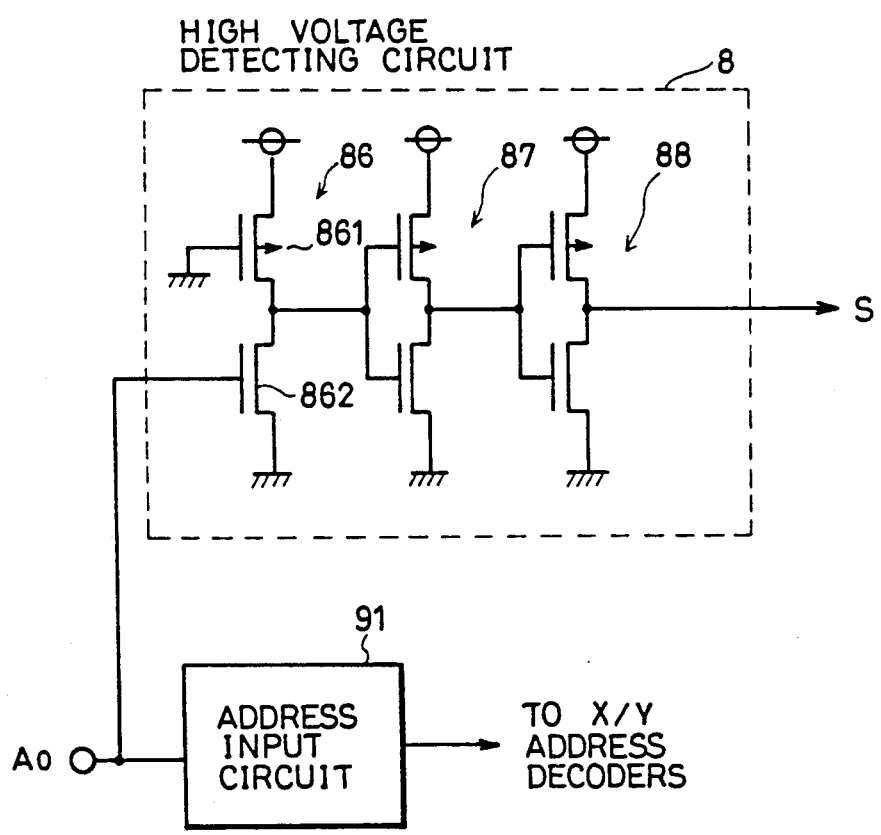
FIG. 5 is a circuit diagram showing an example of mode detecting circuit shown in FIGS. 1 to 3.
Figure 6:
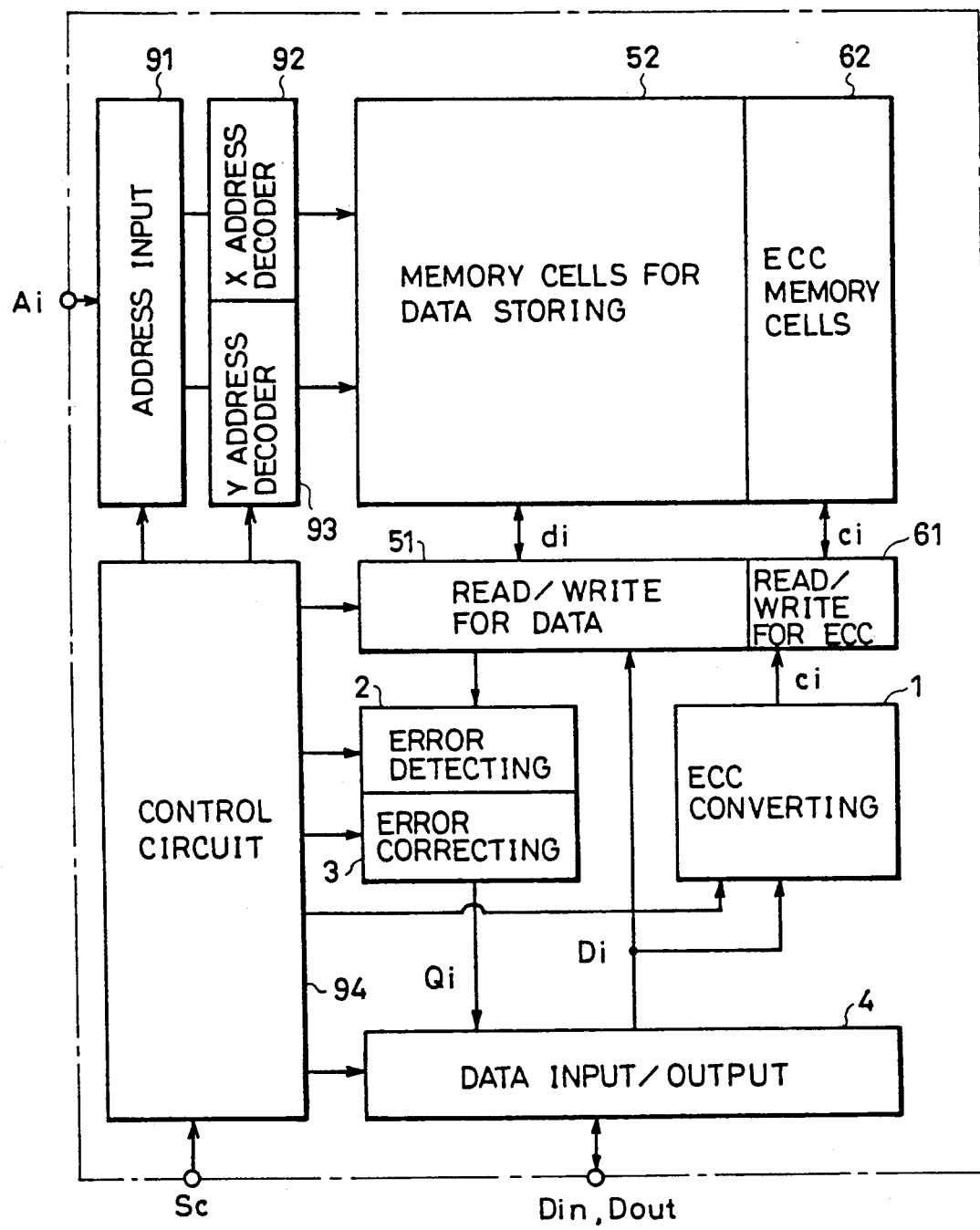
FIG. 6 is a block diagram showing an example of conventional semiconductor memory device to which an error correcting circuit is applied.

FIG. 5 shows an example of the mode detecting circuits 8 shown in FIGS. 1 to 3. Referring to FIG. 5 in the circuit shown, a high voltage detecting circuit 8 is shown as a mode detecting circuit. In particular, the circuit 8 delivers a signal S of a high voltage level when a voltage higher than 10 volts is applied to an address input terminal AO thereof. Since the high voltage level of a normal address signal is about 5 volts, only when the circuit 8 is used and a voltage higher than 10 volts is applied to the address input terminal AO, designation of a testing mode can be detected. The high voltage detecting circuit 8 includes three inverters 86 to 88 connected in a cascade. By controlling transistor sizes of a PMOS transistor 861 and an NMOS transistor 862 of the first stage inverter 86, the high voltage detecting circuit 8 can be constructed such that it may operate with a voltage higher than 10 volts.

While in the embodiments shown in FIGS. 1 to 4A, the data bit length is described being 4 bits and the ECC bit length is described being 3 bits for simplification of explanation, any of the circuits shown in FIGS. 1 to 4A can be applied to a semiconductor memory device wherein the data have bit lengths greater than such specific bit lengths as illustrated in Table 1 given hereinabove.

Thus, where the error correcting circuit shown in FIG. 1 is applied to a semiconductor memory device predetermined preferable test data (that is, data of all "0" can be supplied to ECC memory cells of the semiconductor memory device by means of the ECC data generating circuit 7a. Meanwhile, where the circuit shown in FIG. 2 is applied to a semiconductor memory device, another preferable test data (that is, data of a checker pattern) can be supplied. To the contrary, where the circuit shown in FIG. 3 is applied, arbitrary preferable test data can be selectively supplied from the outside. On the other hand, since a circuit for judging a state of ECC memory cells, that is, the NOR gate 24 or the inverter 25, are provided in the circuit shown in FIG. 1, 2 or 4A, a defective ECC memory cell can be detected readily.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having an error correcting function, comprising, on a chip:
   means for inputting first data;
   means for converting said first data into second data including error correction data;
   first memory cells for storing said first data therein;
   second memory cells for storing said second data including error correction data;
   error detecting means responsive to said data stored in said first and second memory cells for detecting a data error of said data stored in said first memory cells;
   error correcting means connected to said first memory cells and responsive to said error detecting means for correcting an error of data supplied by said first memory cells;
   test data generating means connected between said means for converting said first data into second data including error correction data and said second memory cells, and including
   mode detecting means outputting a signal of either a first and second level in response to a test mode signal, and
   a plurality of common type field effect transistors, each having its gate electrode connected to the output of said mode detecting means, for providing predetermined patterns of test data; and
   test data validation means responsive to said test data stored in said second memory means for supplying a memory data fault signal, wherein
   said second data including error correction data are stored to said second memory cells in response to said first level of said signal output from said mode detecting means, and
   said predetermined patterns of test data are stored to said second memory cells in response to said second level of said signal output from said mode detecting means.

2. The semiconductor memory device according to claim 1, wherein said test data generating means includes selecting means connected to receive externally applied test signals responsive to the test mode signal for selectively delivering the test data to said second memory cells.

3. The semiconductor memory device according to claim 1, wherein said test data generating means includes selective pattern generating means responsive to an externally applied pattern selecting signal for selectively delivering one of a plurality of predetermined test patterns.

4. The semiconductor memory device according to claim 1, wherein said test data generating means includes first switching devices connected between the ground and inputs of said second memory cells responsive to the test mode signal to be switched on.

5. The semiconductor memory device according to claim 1, wherein said test data generating means includes second switching devices alternately connected between inputs of said second memory cells and the ground or a power source responsive to the test mode signal to be switched on.

6. The semiconductor memory device according to claim 1, wherein said semiconductor memory device comprises an erasable programmable read-only memory.

7. The semiconductor memory according to claim 1, further comprising memory cell selection means responsive to an address signal of a first level for selecting one of said first memory cells to be read and test mode detecting means responsive to a second level of said address signal for supplying said test mode signal.

8. The semiconductor memory according to claim 1, wherein said test data validation means includes comparitor means comparing bits of said test data stored in said second memory means and, in response, supplies said memory data fault signal.

9. The semiconductor memory device according to claim 1, wherein
said first and second memory cells, said error detecting means, said error correcting means, said test data generating means and said test data validation means are provided on a common chip.

* * * * *